United States Patent [19]

Kuhn

[11] Patent Number: 4,890,060
[45] Date of Patent: Dec. 26, 1989

[54] ELECTROMECHANICAL ABUTMENT SENSOR WITH RESILIENT DAMPER PLATE FOR SENSING SHEETS IN A SHEET FOLDING MACHINE

[75] Inventor: Wolf Kuhn, Nuremberg, Fed. Rep. of Germany

[73] Assignee: Maschinebau Oppenweiler Binder GmbH & Co., Fed. Rep. of Germany

[21] Appl. No.: 185,146

[22] Filed: Apr. 22, 1988

Related U.S. Application Data

[63] Continuation of Ser. No. 840,412, Mar. 14, 1986, abandoned.

[30] Foreign Application Priority Data

Mar. 15, 1985 [DE] Fed. Rep. of Germany ....... 2509412

[51] Int. Cl.[4] .................. B65H 45/04; G01R 33/12; H02K 35/04; H01F 7/08
[52] U.S. Cl. ................................ 324/239; 270/32; 271/258; 310/14; 324/207; 335/222; 340/686
[58] Field of Search ................. 324/207–209, 324/228, 239; 361/179, 180; 310/12–15, 27–30; 367/182–184; 340/686; 336/100; 73/658, 661; 335/220, 222; 271/110, 227, 258, 262, 263, 265; 270/32

[56] References Cited

U.S. PATENT DOCUMENTS

| | | | |
|---|---|---|---|
| 2,193,978 | 3/1940 | Miller | 310/29 X |
| 2,740,946 | 3/1956 | Geneslay | 310/15 X |
| 2,764,019 | 9/1956 | Lindholm et al. | |
| 3,067,404 | 12/1962 | Hildebrandt | 367/182 |
| 3,133,214 | 5/1964 | Lawson et al. | |
| 3,153,735 | 10/1964 | Branagan et al. | 310/15 |
| 3,270,218 | 8/1966 | Barta | |
| 3,394,275 | 7/1968 | Lippmann | |
| 3,403,547 | 10/1968 | Schwartz | 73/661 X |
| 3,494,180 | 2/1970 | Hansel | 73/658 |
| 3,604,959 | 9/1971 | Sturman | 310/12 |
| 3,739,204 | 6/1973 | Sugawara et al. | |
| 3,943,390 | 3/1976 | Ochiai | 310/15 |
| 4,517,514 | 5/1985 | Howell | 324/207 |
| 4,684,888 | 8/1987 | Tabak | 324/207 |

FOREIGN PATENT DOCUMENTS

| | | |
|---|---|---|
| 3114518 | 3/1982 | Fed. Rep. of Germany . |
| 223965 | 10/1924 | United Kingdom . |
| 224936 | 11/1924 | United Kingdom . |
| 241277 | 10/1925 | United Kingdom . |
| 399598 | 10/1933 | United Kingdom . |
| 1471297 | 4/1977 | United Kingdom . |
| 2027316 | 2/1980 | United Kingdom . |

*Primary Examiner*—Gerard R. Strecker
*Attorney, Agent, or Firm*—John F. A. Earley; John F. A. Earley, III; Michael Walker

[57] ABSTRACT

An electromechanical abutment stop intended particularly for folding machines comprises of a coil (4) and a magnet (2) which are resiliently movable relative to each other. Disposed between coil (4) and magnet (2) is a damper plate (9) of softly resilient material as defined. The abutment sensor is characterized by low overall height. In a preferred embodiment, at least one surface of the damper plate (9) is occupied by projections (10), the shape of which can be used to determine the signal:-mechanical pulse characteristic within wide limits, particularly so that the rise in the magnitude of signal will become ever smaller as the mechanical pulse becomes greater. By limiting the free length of travel $\Delta x$ coil 4 or magnet 2), it is possible to confine the signal within an upper limit or threshold.

11 Claims, 1 Drawing Sheet

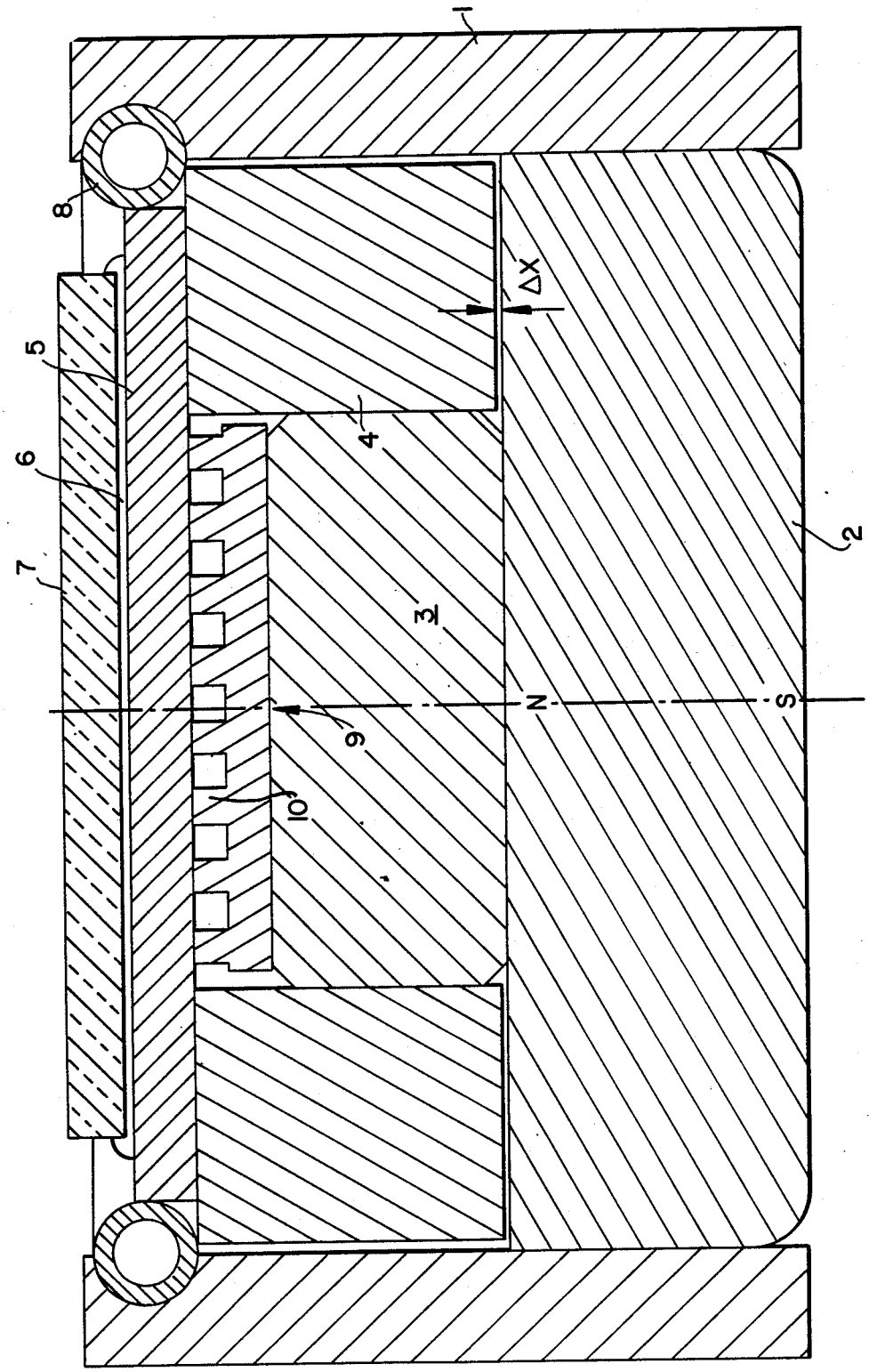

ELECTROMECHANICAL ABUTMENT SENSOR WITH RESILIENT DAMPER PLATE FOR SENSING SHEETS IN A SHEET FOLDING MACHINE

This is a continuation of co-pending Application Ser. No. 840,412, filed on Mar. 14, 1986, now abandoned.

BACKGROUND OF THE INVENTION

1. Field of the Invention

The invention relates to an electromechanical abutment sensor, particularly for folding machines, which includes parts which are movable resiliently relative to each other, said parts comprising a coil and a magnet, preferably a permanent magnet.

2. Description of the Prior Art

In the folding mechanisms of folding machines, the sheets which are to be folded are fed towards an abutment located transversely to the direction of infeed of the sheets. As soon as a sheet which is to be folded has reached its position of rest in front of the abutment, the drive for the folding blade is switched on and the sheet is folded by means of the folding blade. In order to trigger the blade drive, a sensor must be provided which switches on the blade drive as rapidly as possible once the leading edge of the sheet has reached the abutment.

It is known for example from DOS No. 30 22 607 to detect the leading edge of the sheet by means of a light barrier located a certain distance in front of the abutment. In this case, though, an electronic delay and monitoring circuit must be provided to ensure that the blade drive is not switched on before the leading edge of the sheet has reached the abutment. For reasons of space, location of the light barrier directly at the abutment presents difficulty.

It would be more favourable to provide directly at the abutment a sensor which reacts to the pulse from the sheet striking the abutment. Suitable for this are electromechanical abutment sensors which give out an electrical signal in response to a mechanical pulse. The known electromechanical sensors, for example of the type known from U.S. Pat. No. 3,739,204, are however of considerable overall height so that a corresponding depth must be allowed for in order to install them.

The invention is therefore based on the problem of providing an electromechanical abutment sensor which is of the lowest possible installation height.

SUMMARY OF THE INVENTION

According to the invention, this problem is resolved by an electromechanical abutment sensor of the type mentioned at the outset, wherein a softly resilient damper plate is located between coil and magnet.

With this construction, it is possible to achieve an overall height of only a few millimetres so that while retaining the conventional dimensions of the individual folding mechanisms, it is possible electromechanically to detect the infeed of a sheet. Abutment sensors according to the invention can be placed directly on the abutment or can be inserted in recessed bores provided in the abutment. If a plurality of abutment sensors are placed on the abutment, then it is possible, for example even with buckle folding mechanisms, to establish whether the sheet is straight in the folding mechanism or is slanting.

By a suitable choice of the material for the damper plate, it is possible to adapt the signal/pulse characteristic curve within wide limits to the pulse occurring in an individual case which is substantially dependent upon the infeed speed and the weight of the sheets.

To increase sensitivity, a preferred form of embodiment has at least one surface of the damper plate occupied by knobs or projections so that with the same pulse and with an otherwise identical construction of the abutment sensor, a larger signal is achieved.

If the knobs are made cylindrical or of parallelepiped shape, then the characteristic curve, like that of the solid damper plate, is within wide limits substantially linear.

However, if it is intended to handle various weight of sheets in a folding mechanism, then with a minimal pulse it is desirable to obtain the highest possible signal, which would however, result in exceeding the admissible level if heavier papers are to be processed. In a further preferred embodiment, therefore, the projections or knobs may be conical, frustoconical, pyramidal, prismatic or shaped like the frustum of a pyramid.

With such a projection or knob shape, the spring characteristic of the damper plate can be arranged to raise relatively sharply in the region of low forces and to flatten out increasingly for the greater forces. The result is an abutment sensor which with the smaller mechanical pulses responds with great sensitivity, while the sensitivity does not increase substantially for pulses in the higher pulse range.

The sensitivity can be increased further if the surface of the projections which is subject to this pulse is made undulating or is itself covered by small knobs or projections.

The signal can be confined within an upper limit or threshold if the free length of travel of the movable coil or in an alternative embodiment of the movable magnet, is mechanically restricted.

Instead of being used specifically as an electromechanical abutment sensor, and in particular for folding machines, the sensor according to the invention can be used generally as an electromechanical pulse converter. Where such an intended use is involved, a suitable choice of material for the damper plate, and the dimensions and characteristics of coil and magnet can make it possible to keep the signal pulse characteristic as linear as practicable within the range of measurement.

BRIEF DESCRIPTION OF THE DRAWING

The invention will be explained in greater detail hereinafter with reference to an example of embodiment shown in the accompanying drawing, which shows a crosssection through a preferred embodiment of electromechanical abutment sensor.

DETAIL DESCRIPTION

Fixed in an outer cylinder 1 of non-magnetic material is a permanent magnet 2, on which there is in turn a solid inner cylinder 3 which consists, for example, of aluminium. Guided for sliding movement in an axial direction in the annular gap between the outer and inner cylinders 1 and 3 is a coil 4. Fixed on the top surface of the coil 4, for example by adhesive, is a carrier plate 5 preferably consisting of aluminium, and on the surface thereof which is remote from the coil 4 there is fixed by means of a layer of adhesive 6 an abutment plate 7 which consists of non-magnetic very hard material, preferably glass.

Seated in an annular groove, which according to the drawing is provided at the upper end of the outer cylinder 1, is a seal 8 which takes the form of an Oring and which bears on the outer end face of the coil 4 and the periphery of the carrier plate 5, sealing off the interior of the abutment sensor from the outside. The seal 8 at the same time prevents the coil 4 from falling out of the interior of the abutment sensor.

Between that surface of the inner cylinder 3 which is towards the carrier plate 5 and that surface of the carrier plate 5 which carries the coil 4 there is a damper plate 9 of which the surface facing the carrier plate 5 includes projections 10.

The abutment sensor can easily be fixed, for example by adhesion, on the surface of, or in a recess or bore in, the abutment of a folding mechanism.

In operation, when the leading edge of a sheet which is to be folded strikes the abutment plate 7, this latter together with the carrier plate 5 and the coil 4 moves towards the permanent magnet 2. Consequently—the coil 4 being disposed in the most inhomogeneous area possible of the magnetic field of the permanent magnet 2—there is induced into the coil 4 an electric voltage which can be tapped off as an electrical signal at the (not shown) connecting leads of the coil 4. The magnitude of this signal is dependent upon the strength of the mechanical pulse arising from the sheet striking the abutment plate 7. The pattern of the characteristic curve of signal mechanical pulse can be determined substantially by the choice of the material used for the damper plate 9, the shape of the projections 10 and the disposition of the coil 4 in the magnetic field of the magnet 2. If the damper plate 9 can in the region of the pulses which occur in operation become deformed in an axial direction of the coil by a distance which is greater than the free length of travel $\Delta x$ of the coil 4, then the magnitude of the signal tapped at the connecting wires of the coil 4 can be confined by an upper limit. Limiting the free length of travel makes it possible furthermore to achieve the greatest possible consistency of positioning the abutment edge in blade or buckle folding with the various paper weights and paper speeds (otherwise, for example, in buckle folding the paper would no longer always be folded at the same point when the approach speeds differed).

The damper plate 9 should be of a so-called soft resilience i.e. able to yield at the impact loads arising from the abutment of individual sheets at the sheet feed speed, and thereafter to return resiliently ready for the next sheet.

What I claim as my invention and desire to secure by Letters Patent in the United States is :

1. An electromechanical abutment sensor for sheet folding machines for signalling when a sheet is in position for folding comprising
    a magnet,
    a cylinder 3 seated on the magnet,
    a damper plate seated on the cylinder 3,
    a coil having a carrier plate mounted at one end with the carrier plate seated on the damper plate and the coil surrounding the cylinder 3 and with the other end of the coil separated from the magnet by a space,
    the damper plate being resilient to permit movement of the coil towards the magnet when the damper plate is compressed due to a striking sheet pushing the carrier plate against the damper plate and to permit return of the coil to its original position when the force of the striking sheet is abated,
    said damper plate having projections extending upwardly therefrom to receive the force of the striking sheet,
    the relative movement of said magnet and coil towards each other producing varying electric voltages in the coil that may be tapped off as an electric signal to initiate the folding of the sheet.

2. The invention of claim 1,
    said damper plate being interchangeable with other damper plates having projections of different sensitivity.

3. The electromechanical abutment sensor of claim 1,
    the projections being cylindrical, conical, frustoconical, pyramidal, shaped as a frustum of a pyramid, parallelopiped, or prismatic.

4. The electromechanical abutment sensor of claim 1,
    the projections having an outer surface which when taken together form an undulating surface.

5. The electromechanical abutment sensor of claim 1,
    the magnet and the coil having a free length of travel ($\Delta X$), which is limited by an abutment.

6. An electromechanical abutment sensor for sheet folding machines for signalling when a sheet is in position for folding comprising
    a housing,
    a magnet mounted in the housing,
    a damper plate mounted in the housing above the magnet,
    a carrier plate seated on the damper plate having a front surface and a rear surface,
    a coil mounted on the rear surface of the carrier plate and separated from the magnet by a space, and
    an abutment plate mounted on the front surface of the carrier plate for receiving a mechanical force which moves the coil towards the magnet producing an electric voltage in the coil which may be tapped off as an electric signal,
    the damper plate being resilient and being in contact with the carrier plate for dampening the mechanical force received by the abutment plate and for returning the carrier plate, coil, and abutment plate to their original positions after being displaced towards the magnet,
    the resilient damper plate having projections extending vertically away from the damper plate for obtaining the desired sensitivity for the sensor.

7. An electromechanical abutment sensor for sheet folding machines for signalling when a sheet is in position for folding comprising
    a magnet,
    a damper plate mounted above the magnet,
    a coil having a carrier plate mounted at one end with the carrier plate seated on the damper plate and with the coil surrounding the damper plate and with the other end of the coil separated from the magnet by a space,
    the damper plate being resilient to permit movement of the coil towards the magnet when the damper plate is compressed due to a striking sheet pushing the carrier plate against the damper plate and to permit return of the coil to its original position when the force of the striking sheet is abated,
    said damper plate having projections extending upwardly therefrom to receive the force of the striking sheet, the relative movement of said magnet and coil towards each other producing varying electric voltages in the coil that may be tapped off as an electric signal to initiate the folding of the sheet.

8. The invention of claim 7,
said damper plate being interchangeable with other damper plates having projections of different sensitivity.

9. The electromechanical abutment sensor of claim 7, the projections being cylindrical, conical, frustoconical, pyramidal, shaped as a frustum of a pyramid, parallelopiped, or prismatic.

10. The electromechanical abutment sensor of claim 7,
the projections having an outer surface which when taken together form an undulating surface.

11. The electromechanical abutment sensor of claim 7,
the magnet and the coil having a free length of travel ($\Delta X$), which is limited by an abutment.

* * * * *

UNITED STATES PATENT AND TRADEMARK OFFICE
CERTIFICATE OF CORRECTION

PATENT NO. : 4,890,060
DATED : December 26, 1989
INVENTOR(S) : Wolf Kuhn

It is certified that error appears in the above-identified patent and that said Letters Patent is hereby corrected as shown below:

Front page, after Assignee:, change "Maschinebau" to -- Maschinenbau -- .

Signed and Sealed this

Ninth Day of April, 1991

*Attest:*

HARRY F. MANBECK, JR.

*Attesting Officer*      *Commissioner of Patents and Trademarks*